United States Patent
Makino et al.

(10) Patent No.: US 8,902,947 B2
(45) Date of Patent: Dec. 2, 2014

(54) OPTICAL MODULE

(75) Inventors: Shigeki Makino, Tokyo (JP); Yasunobu Matsuoka, Hachioji (JP); Kenji Kogo, Koganei (JP); Toshiki Sugawara, Kokubunji (JP); Tatemi Ido, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/345,787

(22) Filed: Jan. 9, 2012

(65) Prior Publication Data

US 2012/0250711 A1  Oct. 4, 2012

(30) Foreign Application Priority Data

Mar. 29, 2011  (JP) ................ 2011-071331

(51) Int. Cl.
*H01S 5/00* (2006.01)
*G02B 6/12* (2006.01)
(Continued)

(52) U.S. Cl.
CPC ..... *H01S 5/02292* (2013.01); *G02F 2001/0157* (2013.01);
(Continued)

(58) Field of Classification Search
CPC ............... H01S 5/0683; H01S 5/0617; H01S 3/094076; H01S 5/06216; H01S 5/06832; H01S 5/042; H01S 5/06825; H01S 3/107; H01S 5/06213; H01S 5/0427; H01S 5/0264; H01S 5/18308; H01S 5/183; H01S 5/0262; H04B 10/504

USPC ............... 372/50.1, 50.21, 50.22, 29.015, 26; 385/14, 43, 33, 47, 88–94; 257/499; 359/237

See application file for complete search history.

(56) References Cited

U.S. PATENT DOCUMENTS 6,025,213 A    2/2000  Nemoto et al.
6,633,598 B1  10/2003  Kimizuka et al.
(Continued)

FOREIGN PATENT DOCUMENTS

JP    8-186326 A    7/1996
JP   11-74618 A    3/1999
(Continued)

OTHER PUBLICATIONS

Adachi, Koichiro; Shinoda, Kazunori; Fukamachi, Toshihiko; Shiota, Takashi; Kitatani, Takeshi; et a A 1.3-μm lens-integrated horizontal-cavity surface-emitting laser with direct and highly efficient coupling to optical fibers 2009 Conference on Optical Fiber Communication—OFC 2009I.*

(Continued)

*Primary Examiner* — Tod T Van Roy
*Assistant Examiner* — Delma R Forde
(74) *Attorney, Agent, or Firm* — Crowell & Moring LLP

(57) ABSTRACT

An optical module providing higher reliability during high-speed light modulation and a lower bit error rate when built into a transmitter (transceiver). An optical module contains a taper mirror for surface emission of output light, an optical modulator device, and an optical modulation drive circuit, and the optical modulator device and the optical modulation drive circuit are mounted at positions so as to enclose the taper mirror.

12 Claims, 11 Drawing Sheets

(51) Int. Cl.
*H01S 5/026* (2006.01)
*H01S 5/022* (2006.01)
*G02F 1/015* (2006.01)
*H01S 5/42* (2006.01)
*H01S 5/12* (2006.01)

(52) U.S. Cl.
CPC ............... *H01S 5/0265* (2013.01); *H01S 5/42* (2013.01); *H01S 5/02248* (2013.01); *H01S 5/02276* (2013.01); *H01S 5/12* (2013.01); *H01S 5/02288* (2013.01)
USPC ...... 372/50.1; 372/29.01; 372/26; 372/50.21; 372/50.22; 385/14; 385/43; 385/33; 385/47; 385/88; 385/89; 385/90; 385/91; 385/92; 385/93; 385/94; 359/237; 257/499

(56) References Cited

U.S. PATENT DOCUMENTS

| | | | |
|---|---|---|---|
| 7,760,782 B2 | 7/2010 | Aoki | |
| 2004/0101260 A1* | 5/2004 | Sato | 385/94 |
| 2006/0291516 A1* | 12/2006 | Aoki | 372/50.11 |
| 2007/0235715 A1* | 10/2007 | Makino | 257/13 |
| 2009/0129421 A1* | 5/2009 | Kitatani et al. | 372/50.23 |
| 2009/0316745 A1 | 12/2009 | Fukamachi et al. | |
| 2010/0027577 A1* | 2/2010 | Dutta | 372/50.1 |
| 2012/0327965 A1* | 12/2012 | Shinoda et al. | 372/36 |
| 2012/0328229 A1* | 12/2012 | Kogo et al. | 385/8 |

FOREIGN PATENT DOCUMENTS

| | | |
|---|---|---|
| JP | 2001-14720 A | 1/2001 |
| JP | 2001-53223 A | 2/2001 |
| JP | 2004-235182 A | 8/2004 |
| JP | 2006-013048 A | 1/2006 |
| JP | 2007-5594 A | 1/2007 |
| JP | 2010-10155 A | 1/2010 |

OTHER PUBLICATIONS

K. Adachi et al., "Uncooled 25-Gb/s 2-km Transmission of a 1.3-µm Surface-emitting Laser", IEEE, 2010, pp. 76-77.

English translation of Japanese Office Action dated Jun. 3, 2014, (9 pages).

* cited by examiner

OPTICAL MODULE

CLAIM OF PRIORITY

The present application claims priority from Japanese patent application JP 2011-071331 filed on Mar. 29, 2011, the content of which is hereby incorporated by reference into this application.

FIELD OF THE INVENTION

The present invention relates to an optical module ideal for high-speed optical interconnection modules.

BACKGROUND OF THE INVENTION

Technology proposed as a light source for high-speed optical interconnection modules includes vertical cavity surface emitting lasers (VCSEL) and surface emitting laser diodes comprising at least a portion of internal surface plane cavity and taper mirrors mounted at a position to irradiate the output light within the cavity or outside the cavity (These types of optical devices are hereafter referred to as "taper mirror integrated surface emitting laser diodes" in these specifications.).

These "taper mirror integrated surface emitting laser diodes" offer various advantages including high-power operation at high temperatures, high-speed operation, and reduced coupling loss from lens integration and in recent years have been reported capable of direct modulation at 25 Gbps at 85° C. as disclosed in "Uncooled 25-Gb/s 2-km Transmission of a 1.3-µm Surface Emitting Laser" K. Adachi., et al., 22nd IEEE International Semiconductor Laser Conference, (ISLC2010), TuC5.

SUMMARY OF THE INVENTION

Optical modules for modulating the light output usually require a scheme to minimize the effects of electrical noise.

To achieve direct modulation in a "taper mirror integrated surface emitting laser diodes" of the related art, the present inventors have arrayed a modulation drive circuit in the left and right directions along the semiconductor substrate internal plane that is a normal line relative to the output emission direction of a taper mirror integrated surface emitting laser diode when the direction of the cavity within the substrate is set along the front and rear of the device, the same as in ordinary edge emitting laser diodes.

However when a plurality of these "taper mirror integrated surface emitting laser diodes" are clustered together in an "array" and (directly) modulated, the length of the electrical wiring including the wires extending to the "taper mirror integrated surface emitting laser diode" in the center of the array is different from the electrical wiring length extending to the "taper mirror integrated surface emitting laser diode" in the edge of array so that the problem occurred that the effects from high-frequency (RF) noise in the modulation signal differ in each "taper mirror integrated surface emitting laser diodes".

Another problem that occurs is that the electrical wiring in the "taper mirror integrated surface emitting laser diodes" is extremely long in the center of the array so that the high-frequency (RF) noise itself becomes large.

This type of high-frequency (RF) noise prevents accurate modulation and might therefore cause a rise in the bit error rate when an optical device containing "taper mirror integrated surface emitting laser diode" is built into a transmitter (or a transceiver).

Also, the larger the signal loss in the electrical wiring joining the optical modulator device and modulation drive circuit, the larger the output required from the modulation drive circuit, causing the problem of large power consumption.

In view of the above problems with the related art, the present invention has the object of providing an optical module with higher reliability during high-speed light modulation and also a lower bit error rate when the optical device comprising "the taper mirror integrated surface emitting laser diode" is built into a transmitter (transceiver).

As one scheme to achieve the above objects, the optical module is comprised of a taper mirror for surface emission of output light, an optical modulator device, and an optical modulation drive circuit and a unique feature is that the taper mirror is interposed between the optical modulator device and the optical modulation drive circuit.

The present invention renders the effect of providing an optical module comprised of "taper mirror integrated surface emitting laser diodes" and an optical modulator device that provides high reliability during high-speed modulation operation and that lowers bit rate error when the optical module is built into a transmitter (transceiver).

DETAILED DESCRIPTION OF THE PREFERRED EMBODIMENTS

The embodiment of the invention of this specification is described next however the invention is not limited by these embodiments.

First Embodiment

Figure 1A:
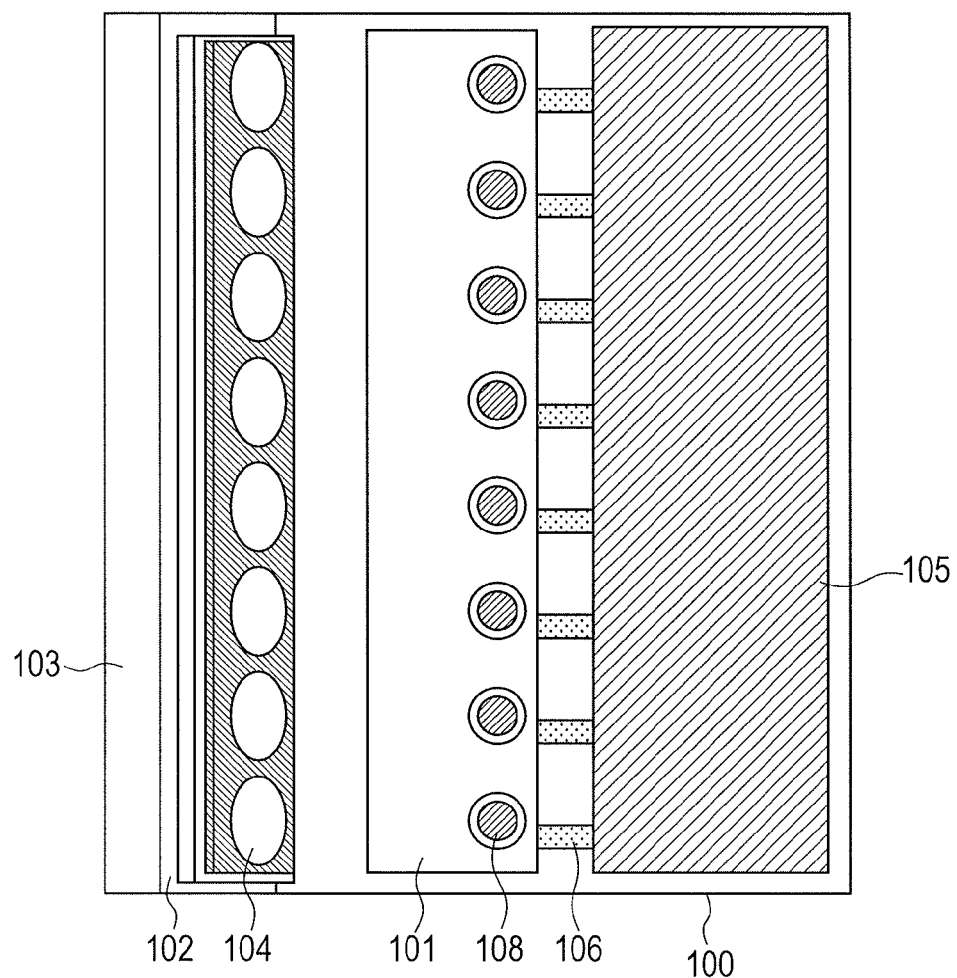
FIGS. 1A and 1B are a top view and a cross sectional view of the optical module of the first embodiment.
Figure 1B:
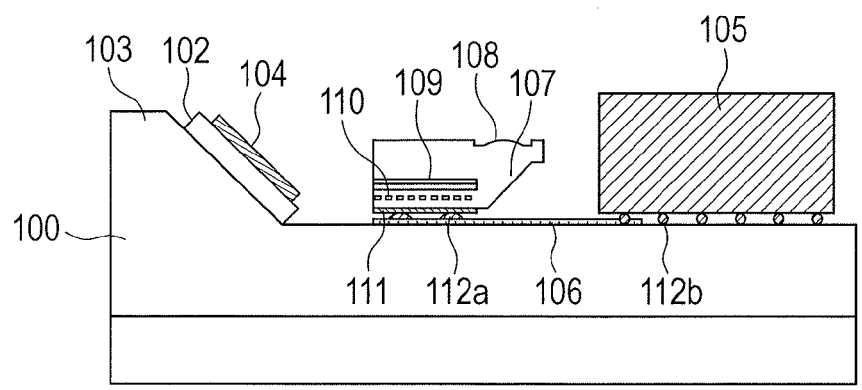

The optical module of the first embodiment is described next while referring to FIG. 1A which is a top view of the optical module, and FIG. 1B which is a cross sectional view of the optical module.

The optical module of the present embodiment is comprised of a substrate 100, a taper mirror integrated direct modulation type laser array 101, a photo diode array 104, and a modulation drive circuit 105.

The substrate 100 is a single layer circuit board containing a high-frequency (RF) electrical wiring 106 over the outermost layer.

The taper mirror integrated direct modulation type laser array 101 is formed by arraying taper mirror integrated direct modulation type lasers in the same direction and integrating them into an "array". Each of the taper mirror integrated direct modulation type lasers taper mirrors 107 are integrated at a position where the output light from the direct modulation laser is incident.

The taper mirror integrated direct modulation type laser array 101 utilizes a semi-insulating layer formed over semi-insulating substrate or conductive substrate (hereafter called, insulating substrate). Also, a distributed feed-back laser: DFB laser array that resonates along the mesa stripe direction can be made by forming an array shape of mesa stripes comprised of at least a section of a stacked layer of sequentially laminated n-type semiconductor layer, an active layer 109, p-type semiconductor layer, a grating 110, and a p-type semiconductor layer. Further, the taper mirror integrated direct modulation type laser array 101 utilizes a structure where an n-electrode 114 coupled to an n-type semiconductor layer and a p-electrode 111 coupled to a p-type semiconductor layer are made over the upper surface of the semi-insulating substrate, and is flip chip bonded to the high-frequency (RF) electrical wiring 106 over the substrate 100.

The taper mirror 107 is comprised of a reflective surface formed by the partial removal of sections over the upper surface of the insulating substrate so that the reflective surface is tilted towards the optical axis formed by normal line of the optical axis of the direct modulation laser. This taper mirror 107 shifts the optical axis of the output light from the direct modulation laser downward (bottom surface of substrate) making the DFB laser a surface emitting type laser.

The taper mirror integrated direct modulation type laser array 101 is further made into a lens integrated type by trimming the bottom surface of the semi-insulating substrate at an incident point of the reflected light from the taper mirror on the bottom surface of the semi-insulating substrate (for example a position directly beneath the taper mirror). This lens 108 boosts the coupling efficiency to the fiber (not shown in drawing). However, if the optical coupling efficiency tolerance is sufficiently-high, then this lens 108 is not indispensable.

Figure 3:
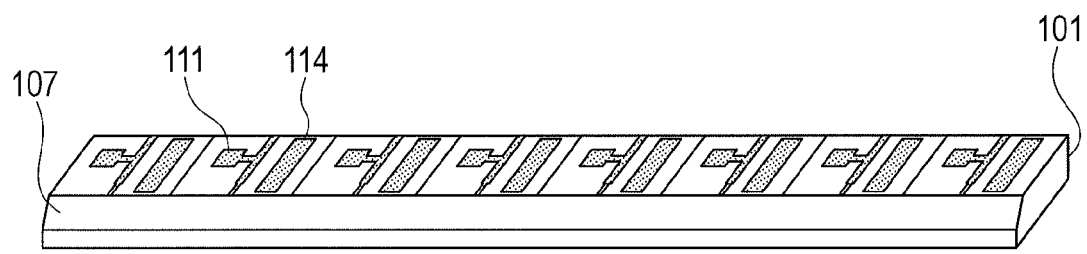
FIG. 3 is a top (bird's eye) perspective view of the direct modulation laser of the first and the second embodiment.

FIG. 3 is a top (bird's eye) perspective view of the direct modulation type DFB laser array formed in this way. Though not shown in the drawing, the present embodiment utilizes an insulating substrate so that the electrical isolation between adjacent taper-mirror-integrated direct-modulation-type lasers can be enhanced by trimming away the upper conductive layer until the semi-insulating layer is reached.

A photo diode array 104 is mounted over the sub-carrier 102, and a sub-carrier 102 is mounted over the substrate 100. The photo diode array 104 is therefore not directly mounted over the substrate 100 but is indirectly mounted by way of the sub-carrier 102 over the substrate 100. The subcarrier 102 mounting the photodiode array 104 is mounted over the inclined plane of the protrusion piece 103 of the trapezoid mounted over the substrate 100. The normal line on the light sensitive (receiving) surface is shifted 90 degrees from the main planar surface of the substrate 100 towards the direct modulation laser so that an obtuse angle is formed between the photo diode array 104 and the main planar surface of the substrate 100. The light sensitive surface of the photo diode array 104 is set facing obliquely upwards. This arrangement prevents the light emitted from the rearward edge surface of the taper mirror integrated direct modulation type laser array 101 from reflecting on the light sensitive surface of the photo diode array 104 and once again irradiating onto the rearward edge surface of the taper mirror integrated direct modulation type laser array 101. The photo diode array 104 is positioned along the rearward extension line (position facing rearward edge surface) on the opposite side of the taper mirror 107 of the taper mirror integrated direct modulation type laser array 101. In other words the taper mirror integrated direct modulation type laser array 101 is interposed between the photo diode 104 and the (direct) modulation drive circuit 105. Placement in this position prevents interference with the (direct) modulation drive circuit 105 and the high-frequency (RF) electrical wiring 106. This photo diode array 104 receives the light emitted from the rearward edge surface of the taper mirror integrated direct modulation type laser array 101, and monitors fluctuations in the light intensity input to the photo diode array 104 due to changes in the environmental temperature, and adjusts the electrical signal output by regulating the feedback to the (direct) modulation drive circuit 105 to maintain a fixed extinction ratio and light intensity.

The (direct) modulation drive circuit 105 that emits a direct modulation drive signal is flip-chip bonded on the forward side (along extension line) on the taper mirror 107 side that irradiates the main emission light from the taper mirror integrated direct modulation type laser array 101. The p-side electrode 111 for each direct modulation laser device positioned in the taper mirror integrated direct modulation type laser array 101 is electrically coupled to the direct modulation drive circuit 105 by the solder 112a, 112b and the high-frequency (RF) electrical wiring 106, to supply the direct modulation drive signal. Though not shown in the drawing, the output from the photo diode array 104 is input to the direct modulation drive circuit 105 by way of separate high-frequency (RF) electrical wiring.

An optical module comprised of an optical device that is taper mirror integrated optical modulator device (in the first embodiment, a taper mirror integrated surface emitting laser diode with taper mirror integrated onto the direct modulation laser), and a drive circuit for modulation of the optical modulator device (in the first embodiment, a direct modulation drive circuit); and in which the optical modulator device, the taper mirror, and the modulation drive circuit are arrayed in that sequence so that the taper mirror is interposed between the optical modulator device and the modulation drive circuit. In other words, in the mesa stripe direction (direction of resonance), by positioning the modulation drive circuit in a direction opposite the optical modulator device (backside of taper mirror) based on the taper mirror, so the optical modulator device and the modulation drive circuit can be positioned close to each other without interfering with the output light (light reflecting from taper mirror). If the optical modulator device and modulation drive circuit can be placed in proximity to each other, then signal loss and effects from noise due to wiring resistance can be suppressed since the electrical wiring joining the optical modulator device and modulation drive circuit can be shortened. The higher the speed of the electrical signals, the larger the attenuation within the wiring joining the optical modulator device and modulation drive circuit. However the proximity positioning achieved in this embodiment enhances the reliability during high speed operation so that the bit error rate can be lowered when the optical module is built into transmitters (transceivers). Moreover, the larger the signal loss in the wiring joining the optical modulator device and modulation drive circuit, the higher the output that is required from the modulation drive circuit, however if the modulation drive circuit can be mounted in proximity to the optical modulator device as in the present embodiment, then the drive circuit can operate at a lower power consumption.

The present embodiment with the above described structure is therefore capable of rendering a high-performance optical module with reduced electrical signal loss, high speed operation, and low-power consumption.

Second Embodiment

Figure 2A:
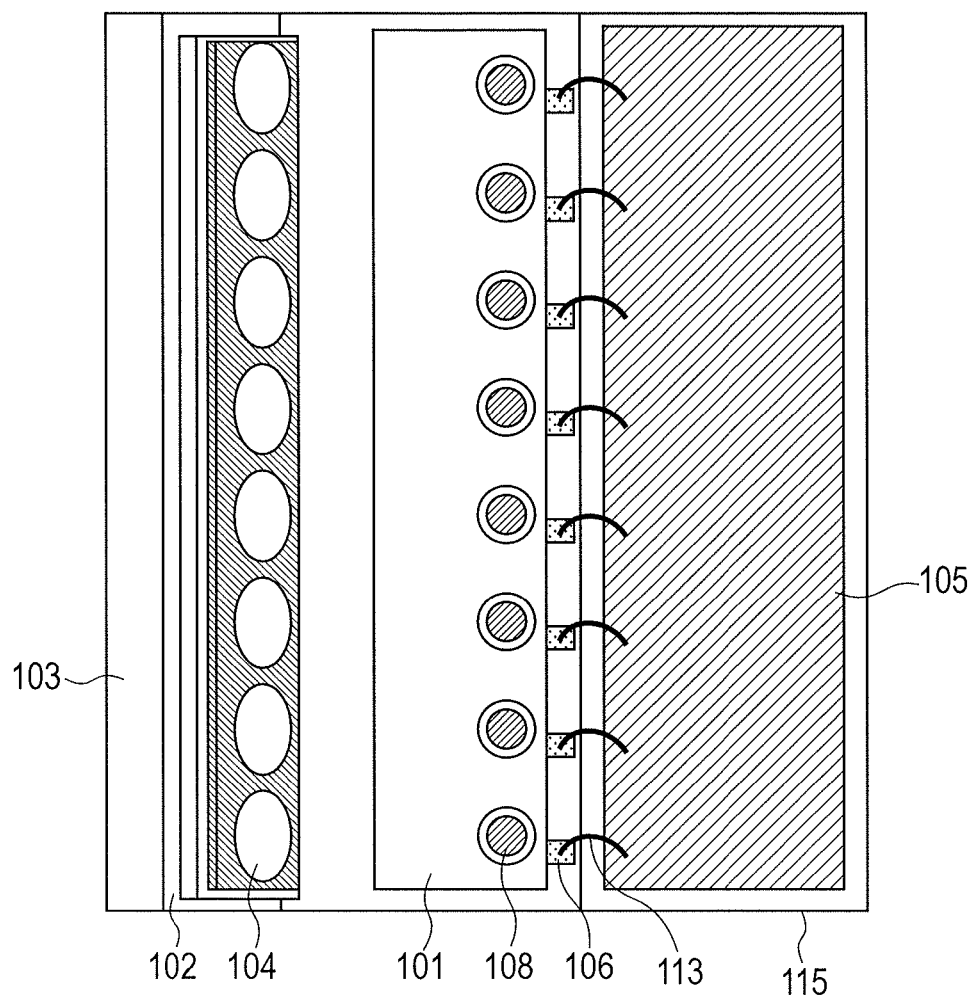
FIGS. 2A and 2B are a top view and a cross sectional view of the optical module of the second embodiment.
Figure 2B:
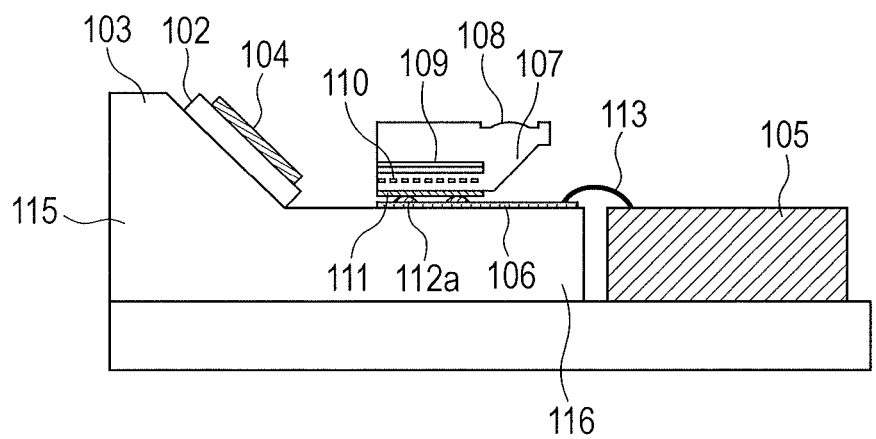

The optical module of the second embodiment is described next utilizing the top view of the optical module in FIG. 2A and the cross sectional view of the optical module in FIG. 2B.

The second embodiment largely differs from the first embodiment in the points that the substrate 100 in FIG. 1 is a multi-layer substrate 115, the forming of a step section 116 by stripping away sections of the upper layer of the multi-layer substrate 115, and mounting the taper mirror integrated direct modulation type laser array 101, photo diode array 104, and high-frequency (RF) electrical wiring 106 over the upper step surface of the step section 116, and then mounting the modulation drive circuit 105 over the lower step surface of the step section 116 by die bonding, and coupling the modulation drive circuit 105 and the high-frequency (RF) electrical wiring 106 by a wire 113.

The optical module of this embodiment, the same as in the first embodiment is comprised of an optical device with taper mirrors integrated over the optical modulator device (in the second embodiment, a taper mirror integrated surface emitting laser diode with taper mirrors integrated over the direct modulation laser), and a modulation drive circuit for modulation drive of the optical modulator device (in the second embodiment, a direct modulation drive circuit); and in which the optical modulator device, the taper mirror, and the modulation drive circuit are arrayed in sequence (in that order) so that the taper mirror is interposed between the optical modulator device and the modulation drive circuit. In other words, in the mesa stripe direction (direction of resonance), by positioning the modulation drive circuit in a direction opposite the optical modulator device (backside of taper mirror) based on the taper mirror, the optical modulator device and the modulation drive circuit can be positioned close to each other without interfering with the output light (light reflecting from taper mirror). If the optical modulator device and modulation drive circuit can be placed in proximity to each other, then signal loss and effects from noise due to wiring resistance can be suppressed since the electrical wiring joining the optical modulator device and modulation drive circuit can be shortened. The higher the speed of the electrical signals, the larger the attenuation within the wiring joining the optical modulator device and modulation drive circuit. The proximity positioning achieved in this embodiment, therefore enhances the reliability during high speed operation so that the bit error rate can be lowered when the optical module is built into transmitters (transceivers). Moreover, the larger the signal loss in the wiring joining the optical modulator device and modulation drive circuit, the higher the output that is required from the modulation drive circuit. However if the modulation drive circuit can be mounted in proximity to the optical modulator device as in the present embodiment, then the drive circuit can operate at lower power consumption.

The second embodiment possessing the above described structure is therefore capable of rendering a high-performance optical module with reduced electrical signal loss, high speed operation, and low-power consumption.

Further, in the second embodiment, besides mounting the direct modulation laser serving as the taper mirror integrated surface emitting type laser diode functioning as the optical modulator device over the upper step surface of the step section 116 and the high-frequency (RF) electrical wiring 106; the modulation drive circuit 105 is mounted over the lower step of the step section 116 by die-bonding so that the wire length of the wire 113 joining the electrodes over the upper surface of the modulation drive circuit 105 and high-frequency (RF) electrical wiring 106 can be shortened. The wiring length of the wire 113 can therefore be shortened and effects from signal loss and noise can be suppressed compared to the case where joining the high-frequency (RF) electrical wiring 106 and the modulation drive circuit 105 without utilizing the step section 116 or in other words, mounting both the optical modulator device and the modulation drive circuit 105 over the surface on the same substrate. The bit error rate when the optical module is mounted into a transmitter (transceiver) can therefore be reduced and the drive circuit can operate at low power consumption.

The present embodiment with the structure described above is therefore capable of rendering a high-performance optical module with reduced electrical signal loss, high speed operation, and low-power consumption.

Third Embodiment

Figure 4A:
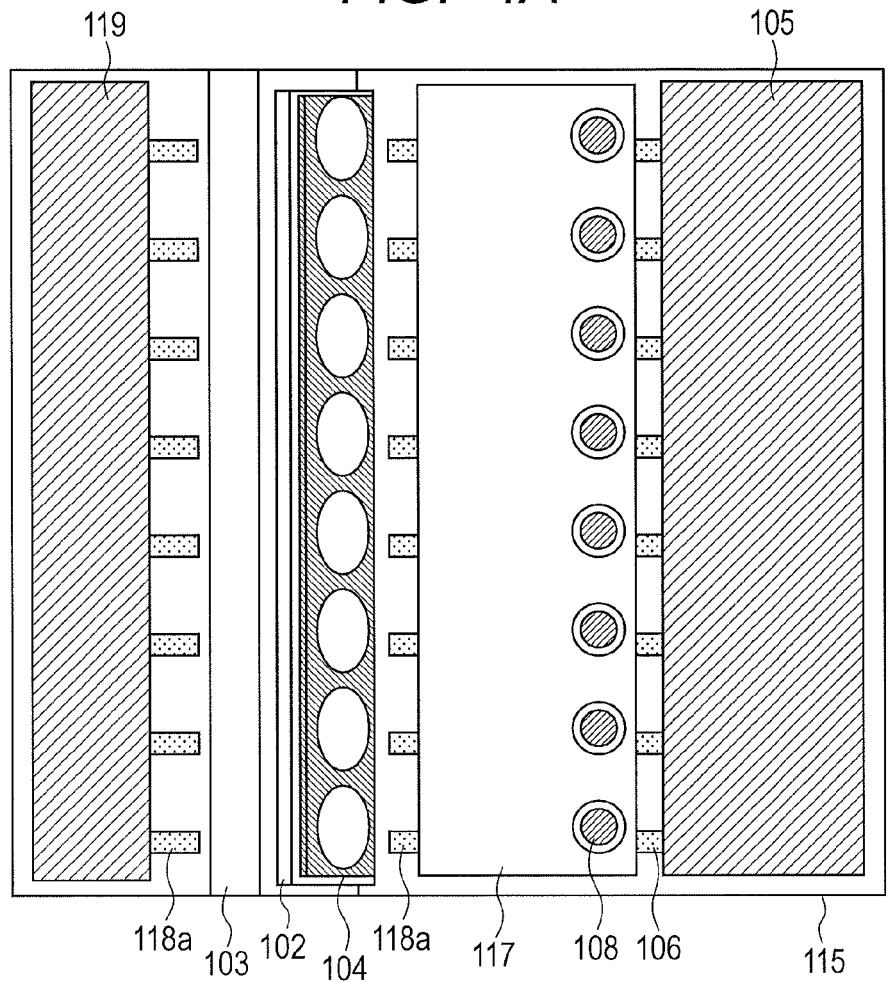
FIGS. 4A and 4B are a top view and a cross sectional view of the optical module of the third embodiment.
Figure 4B:
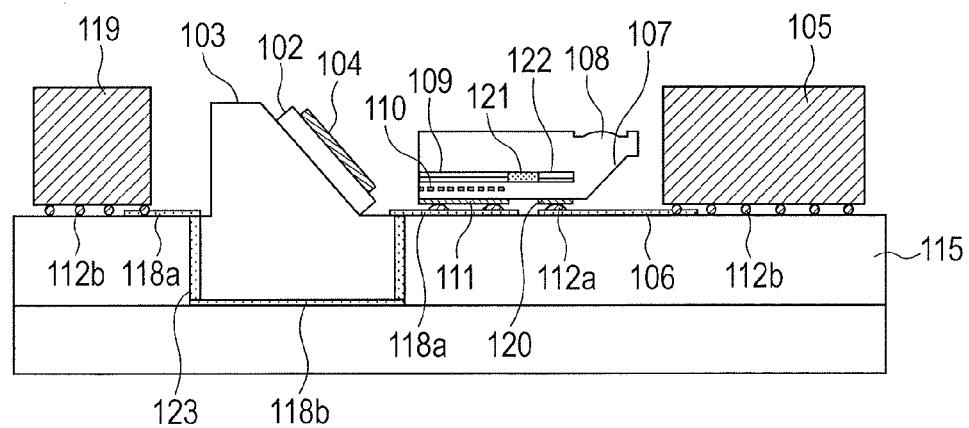

The optical module of the third embodiment is described next utilizing the top view of the optical module in FIG. 4A and the cross sectional view of the optical module in FIG. 4B.

The most significant point where the present embodiment differs from the first embodiment is that the first embodiment utilized a taper mirror integrated surface emitting laser diode serving as the direct modulation laser, as an optical device in which taper mirrors are integrated over the optical modulator device. However the third embodiment utilizes an electro-absorption modulator integrated DFB laser: EA/DFB laser array 117 as an optical device with taper mirrors integrated into the optical modulator device. Namely, the direct modulation laser was changed to a continuous-wave laser diode: CW laser, and the EA modulator device serving as the EA modulator absorption layer 122 was integrated forward of the continuous-wave laser diode (right side of FIG. 4). In other words, the EA modulator absorption layer 122 was integrated at a position enclosed by the continuous-wave laser diode and the taper mirror. An optical waveguide 121 is integrated as a satisfactory butt joint between the EA modulator absorption layer 122 and the DFB laser. The following changes were also implemented along with the above changes.

A: The modulation drive circuit 105 was changed to a modulation drive circuit 105 exclusively for modulator devices rather than for direct modulation with superimposed DC oscillation components.

B: The continuous-wave drive circuit 119 for driving the continuous-wave DFB laser was made a separate unit from the modulation drive circuit 105, and is flip chip bonded further to the rear of the protrusion piece 103 (right side on FIG. 4 is the front).

C: The p-side electrode 120 for each EA modulator positioned in the EA modulator integrated DFB laser array 117 is electrically coupled to the modulation drive circuit 105 by the solder 112a, 112b and the high-frequency (RF) electrical wiring 106.

D: In order to electrically couple the continuous-wave drive circuit 119 to the continuous-wave DFB laser, the substrate 100 of the first embodiment was changed to the multi-layer substrate 115 including the electrical wires 118a, 118b and the high-frequency (RF) electrical wiring 106; the continuous-wave drive circuit 119 and the p-side electrode 111 of each DFB laser mounted over the EA modulator integrated DFB laser array 117 were electrically coupled by the solder 112a, 112b, the electrical wires 118a, 118b, and via (through holes) 123.

The optical module of this embodiment, the same as in the first embodiment, is comprised of an optical device with taper mirror integrated over the optical modulator device (in the third embodiment, a taper mirror integrated surface emitting laser diode serving as the EA/DFB laser), and a modulation drive circuit for modulation-driving of the optical modulator device (in the third embodiment, an (EA) modulation drive circuit), and in which the optical modulator device, the taper mirror, and the modulation drive circuit are arrayed in that order (in sequence), so that the taper mirror is interposed between the optical modulator device and the modulation drive circuit. In other words, by positioning the modulation drive circuit along the mesa stripe (direction of resonance) in a direction opposite the optical modulator device (backside of taper mirror) based on the taper mirror, the optical modulator device and the modulation drive circuit can be positioned close to each other without interfering with the output light (light reflecting from taper mirror). If the optical modulator device and modulation drive circuit can be placed in proximity to each other, then signal loss and effects from noise due to wiring resistance can be suppressed since the electrical wiring joining the optical modulator device and modulation drive circuit can be shortened. The higher the speed of the electrical signals, the larger the attenuation within the wiring joining the optical modulator device and modulation drive circuit. The proximity positioning achieved in this embodiment therefore enhances the reliability during high speed operation so that the bit error rate can be lowered when the optical module is built into transmitters (transceivers). Moreover, the larger the signal loss in the wiring joining the optical modulator device and modulation drive circuit, the higher the output that is required from the modulation drive circuit. However, if the modulation drive circuit can be mounted in proximity to the optical modulator device as in the present embodiment, then the drive circuit can operate at lower power consumption.

In the third embodiment, the continuous-wave drive circuit 119 for driving the continuous-wave DFB laser is flip chip bonded further to the rear of the protrusion piece 103 (set so the right side on FIG. 4 is the front), and is coupled by way of the multi-layer substrate 115 to the continuous-wave drive circuit 119 and the continuous-wave DFB laser. The electrical signals supplied from the continuous-wave drive circuit 119 are direct current signals and so have little energy loss even if propagating through somewhat complicated circuits. This type of placement allows compactly mounting the optical device array and its drive circuit and the monitor function components.

The present embodiment with the above described structure is therefore capable of rendering a high-performance optical module with reduced electrical signal loss, high speed operation, and low-power consumption.

Fourth Embodiment

Figure 5A:
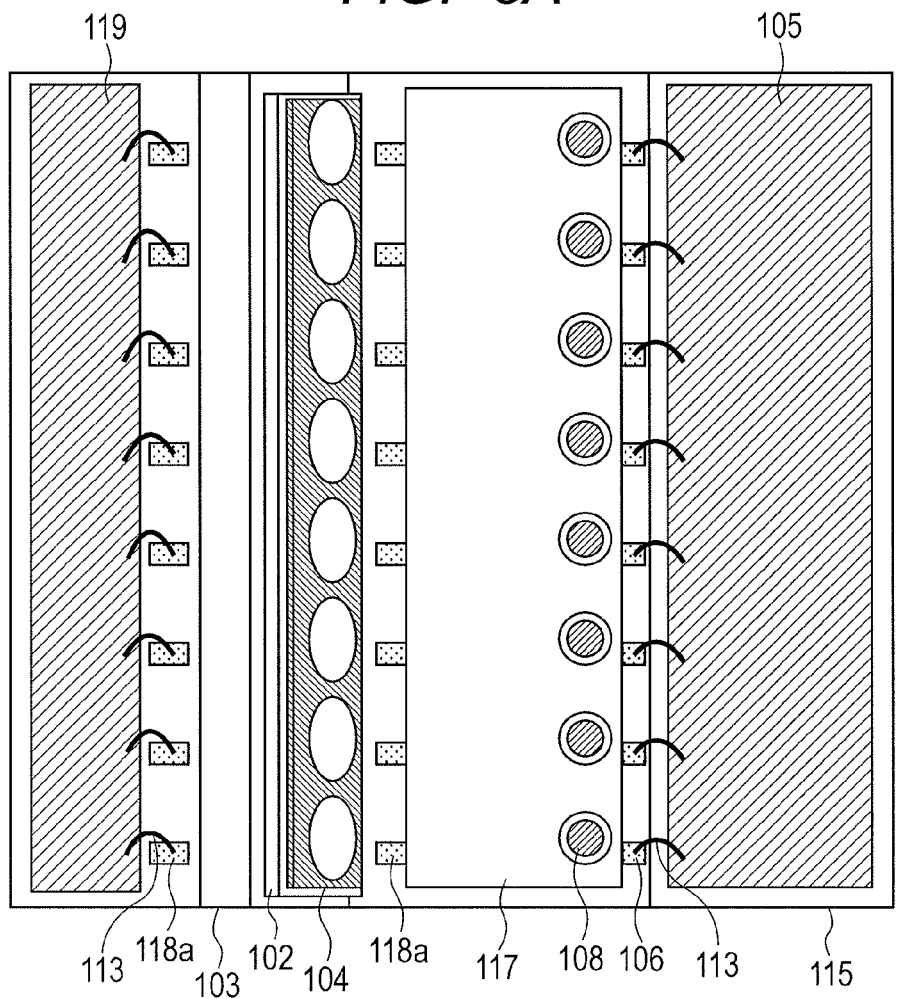
FIGS. 5A and 5B are a top view and a cross sectional view of the optical module of the fourth embodiment.
Figure 5B:
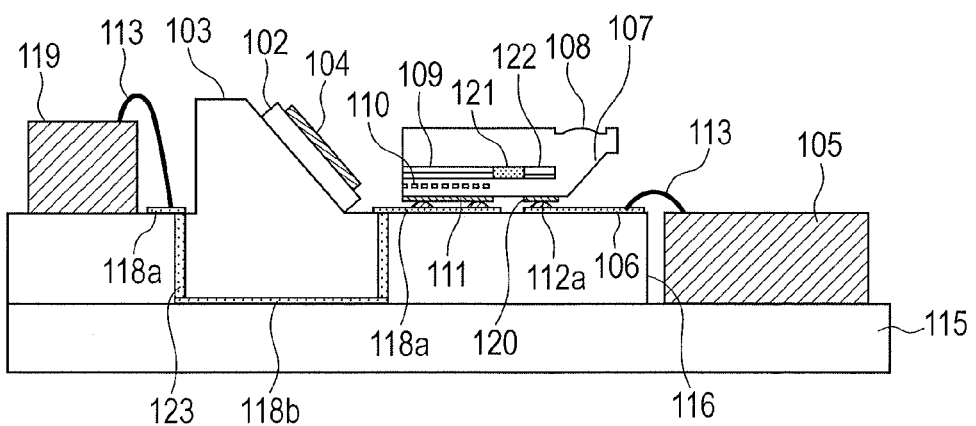

The optical module of the fourth embodiment is described next utilizing the top view of the optical module in FIG. 5A and the cross sectional view of the optical module in FIG. 5B.

The significant points where this embodiment differ from the third embodiment are that along with forming a step section 116 by partially stripping away the upper layer of the multi-layer substrate 115 in FIG. 4, and mounting the EA modulator integrated DFB laser array 101, the photo diode array 104, and the high-frequency (RF) electrical wiring 106 over the upper step surface of this step section 116, the method for mounting the continuous-wave drive circuit 119 is changed to wire bonding to couple the electrical wiring (electrical wire 118b and via 123) of the multi-layer substrate 115 by the wire 113, and mounting the modulation drive circuit 105 over the lower step surface of the step section 116 by die bonding, and coupling the modulation drive circuit 105 to the high-frequency (RF) electrical wiring 106 by the wire 113.

The optical module of this embodiment, the same as in the first embodiment is comprised of an optical device having taper mirror integrated over the optical modulator device (in the fourth embodiment, a taper mirror integrated surface emitting laser diode serving as the EA/DFB laser), and a modulation drive circuit for modulation-driving of the optical modulator device (in the fourth embodiment, an (EA) modulation drive circuit), and in which the optical modulator device, the taper mirror, and the modulation drive circuit are arrayed in that sequence, so that the taper mirror is interposed between the optical modulator device and the modulation drive circuit. In other words, in the mesa stripe direction (direction of resonance) by positioning the modulation drive circuit in a direction opposite the optical modulator device (backside of taper mirror) based on the taper mirror, the optical modulator device and the modulation drive circuit can be positioned close to each other without interfering with the output light (light reflecting from taper mirror). If the optical modulator device and modulation drive circuit can be placed in proximity to each other, then signal loss and effects from noise due to wiring resistance can be suppressed since the electrical wiring joining the optical modulator device and modulation drive circuit can be shortened. The higher the speed of the electrical signals, the larger the attenuation within the wiring joining the optical modulator device and modulation drive circuit. The proximity positioning achieved in this embodiment therefore enhances the reliability during high speed operation so that the bit error rate can be lowered when the optical module is built into transmitters (transceivers). Moreover, the larger the signal loss in the wiring joining the optical modulator device and modulation drive circuit, the higher the output that is required from the modulation drive circuit. However, if the modulation drive circuit can be mounted in proximity to the optical modulator device as in the present embodiment, then the drive circuit can operate at lower power consumption.

The optical modulator device and the high-frequency (RF) wiring 106 are further mounted over the upper step surface of the step section 116 of substrate 115, and the modulation drive circuit 105 is mounted over the lower step surface of the step section 116 the same as in the second embodiment so that the wire length of the of the wire 113 joining the high-frequency (RF) electrical wiring 106 with the electrode over the upper surface of the modulation drive circuit 105 can be shortened. Effects from signal loss and noise can therefore be suppressed to an extent equivalent to the amount that the wire was shortened, when compared to the case when there is no step section 106 or in other words, cases where the modulation drive circuit 105 is mounted over the same substrate. The bit error rate can therefore be lowered when the optical module is built into transmitters (transceivers) and driven with low power consumption.

The continuous-wave drive circuit 119 for driving the continuous-wave DFB laser, is mounted further to the rear of the protrusion piece 103 (right side on FIG. 5 is the front), and is coupled by way of the multi-layer substrate 115 to the continuous-wave drive circuit 119 and the continuous-wave DFB laser the same as in the third embodiment. The electrical signals supplied from the continuous-wave drive circuit 119 are direct current signals and so have little energy loss even if propagating through somewhat complicated circuits. This type of placement allows compactly mounting the optical device array and its drive circuit and the monitor function components.

The present embodiment with the structure as described above is therefore capable of rendering a high-performance optical module with reduced electrical signal loss, high speed operation, and low-power consumption.

Fifth Embodiment

Figure 6A:
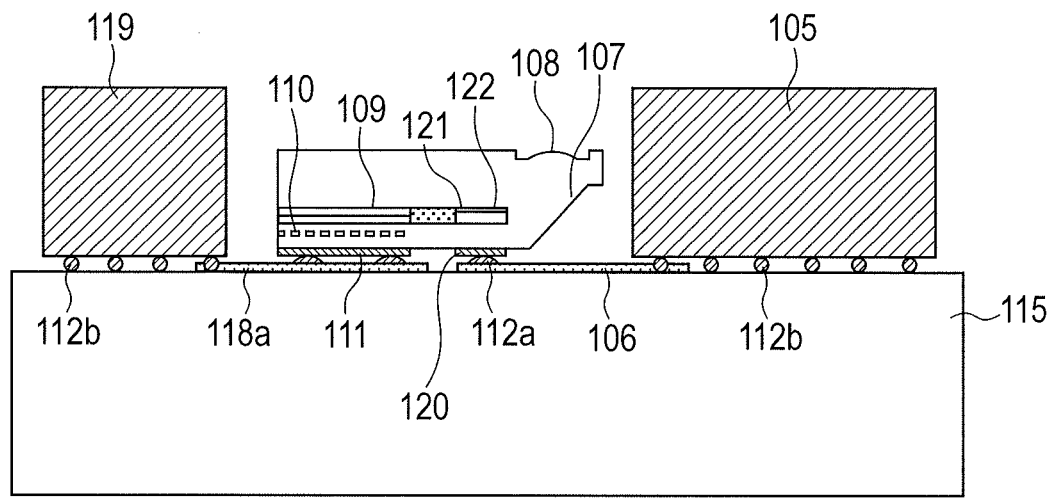
FIG. 6A is a cross sectional view showing the optical module of the fifth embodiment.
Figure 6B:
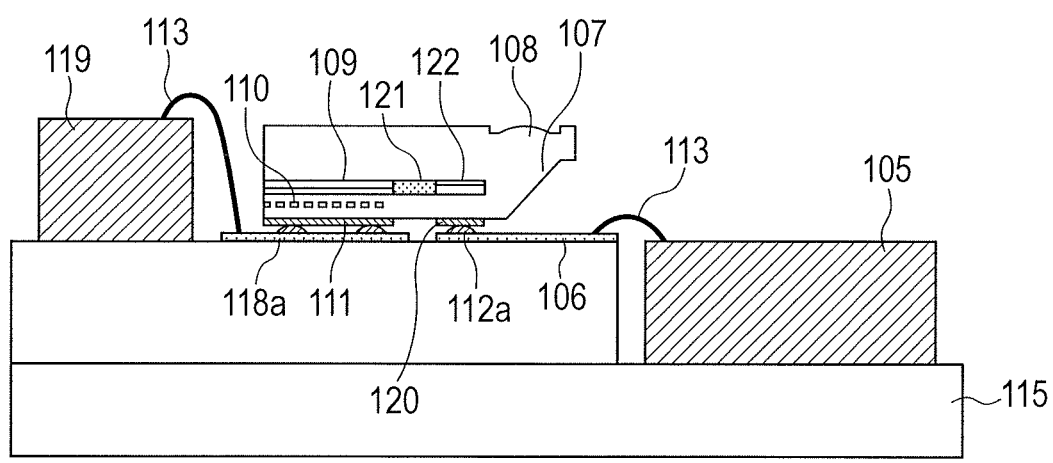
FIG. 6B is a cross sectional view showing the optical module of the fifth embodiment.

FIGS. 6A and 6B are cross sectional views showing the optical module when no photo diode array 104 is mounted. The point where this embodiment differs from the third and the fourth embodiment is that there no photo diode array 104 has been mounted as shown in FIG. 6A and 6B. Besides having no photo diode array, there is also no sub carrier 102 and protrusion piece 103. If the temperature in the vicinity of the device can be monitored such as by a thermistor and outputting an electrical signal that varies with the temperature is fed back to the modulation drive circuit 105 then the same functions as in the third and fourth embodiments can be achieved even without a photo diode array.

<Example using an EA (Electro-Absorption) Modulator Integrated DFB Laser Array>

Figure 7A:
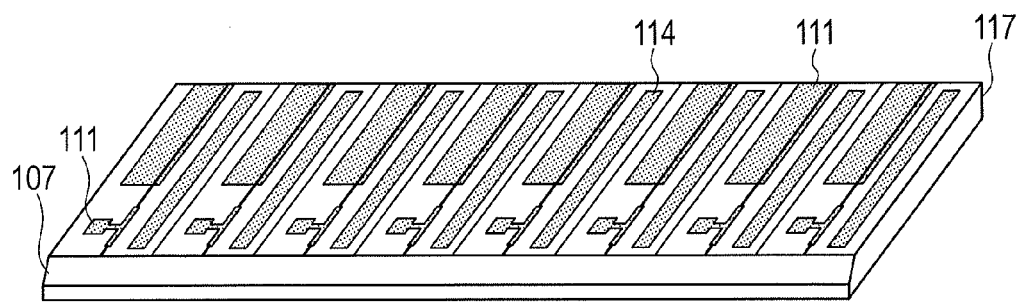
FIG. 7A is a top (bird's eye) perspective view of the EA modulator integrated laser.
Figure 7B:
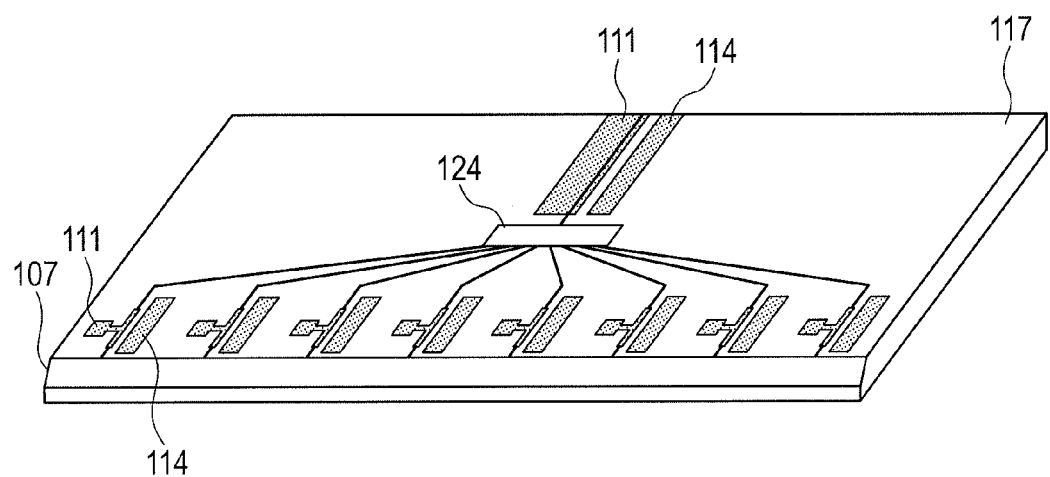
FIG. 7B is a top (bird's eye) perspective view of the EA modulator integrated laser.
Figure 8:
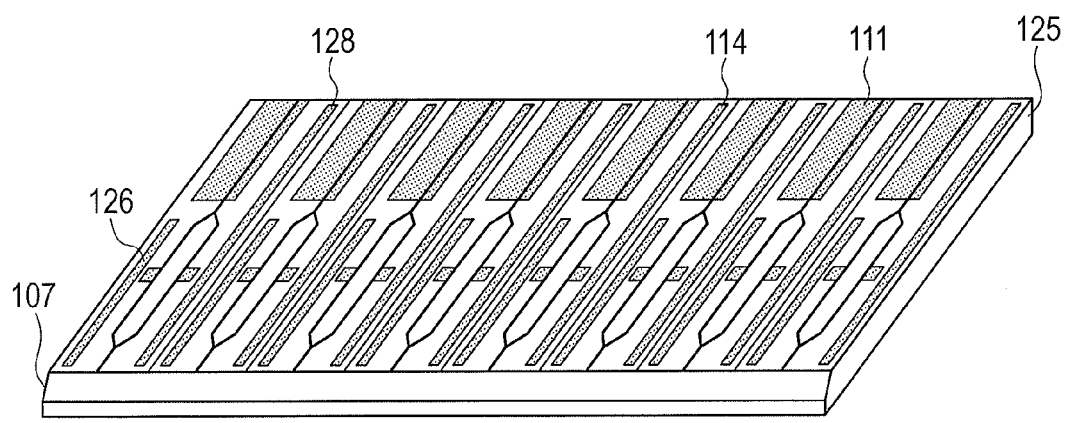
FIG. 8 is a top (bird's eye) perspective view of the MZ modulator integrated laser.

FIGS. 7A and 7B are perspective views of the preferred electro-absorption modulator integrated DFB laser array 117 (hereafter EA/DFB laser array 117) of the third, fourth and fifth embodiments.

FIG. 7A is a view of the EA/DFB laser array 117 mounted over an insulated substrate. In FIG. 7B, the output light from one DFB laser is input to a plurality of EA modulators by a multi-mode interferometer: MMI 124. Reducing the number of continuous-wave light sources allows suppressing heat emission and saving electrical power.

<Example using an MZ Modulator Integrated DFB Laser Array>

An optical modulator array integrating an EA modulator was described in the third, fourth, and fifth embodiments. However, a Mach-Zehnder type modulator formed over an insulating substrate may also be utilized. The Mach-Zehnder type modulator integrated DFB laser array 125 contains p-electrodes 126 and n-electrodes 128 mounted over an insulating substrate. The electrical isolation between adjacent elements can be further enhanced by stripping away material until reaching the insulating substrate is reached.

Sixth Embodiment

Figure 9A:
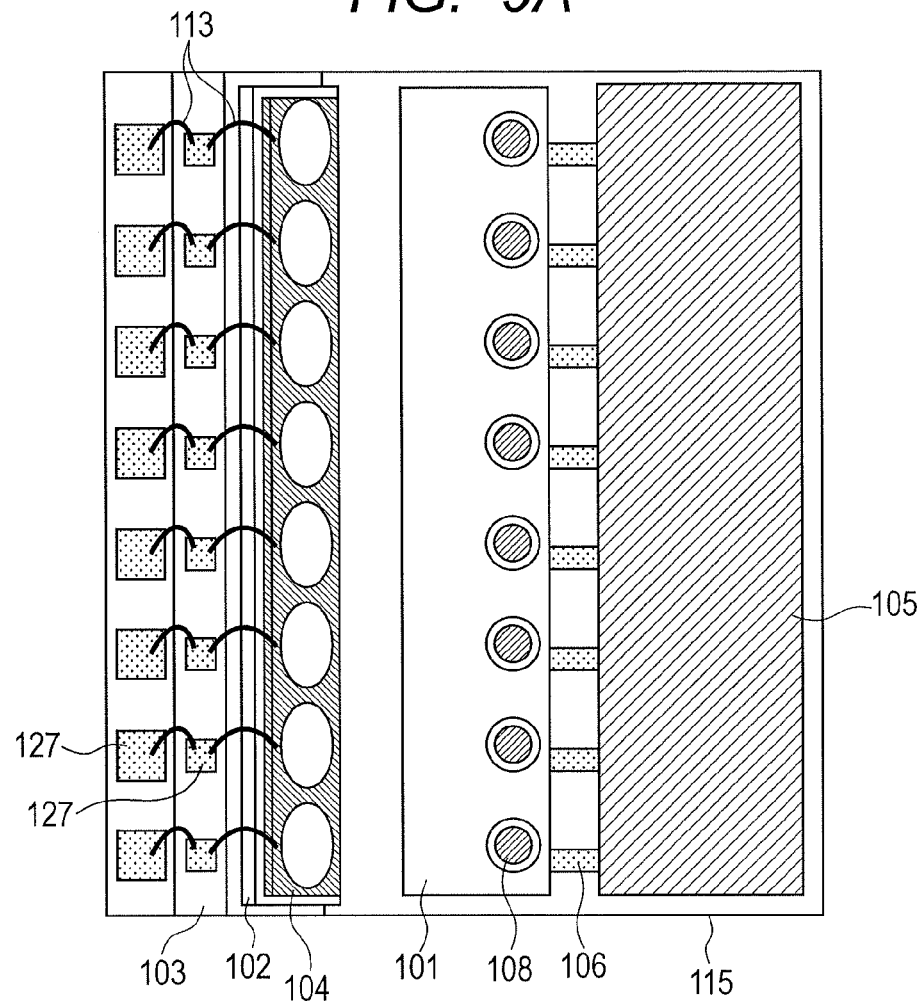
FIGS. 9A and 9B are a top view and a cross sectional view of the optical module of the sixth embodiment.
Figure 9B:
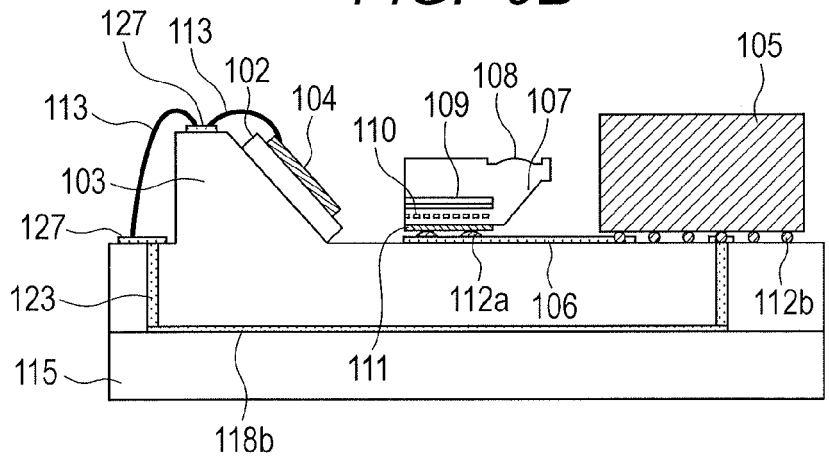

The optical module of the sixth embodiment is described next utilizing the top view of the optical module in FIG. 9A and the cross sectional view of the optical module in FIG. 9B.

The present embodiment differs largely from the first embodiment in the point that the multi-layer substrate 115 is used. The effect rendered by placement of the taper mirror integrated direct modulation type laser array 101, the photo diode array 104, and the modulation drive circuit 105 is the same as described in the first embodiment so a detailed description is omitted.

A further point differing from the first embodiment is that the photo diode array 104 and the modulation drive circuit 105 are coupled by utilizing the via (through hole) 123 and the electrical wire 118b of the multi-layer substrate 115, and the wire 113. The photo diode array 104 and the modulation drive circuit 105 are more specifically coupled electrically by utilizing the wire 113, the electrical wiring pad 127, the via 123, the electrical wire 118b and the solder 112b.

In general the intensity and extinction ratio of the optical signal under the same bias conditions usually tend to vary due to environmental temperature fluctuations and changes over time. However the extinction ratio and the light intensity can be maintained at the desired value as achieved in the present embodiment, by electrically coupling the photo diode array 104 and the modulation drive circuit 105, and by providing feedback control to the modulation drive circuit 105 so that each photo diode emits a fixed photocurrent.

Seventh Embodiment

Figure 10A:
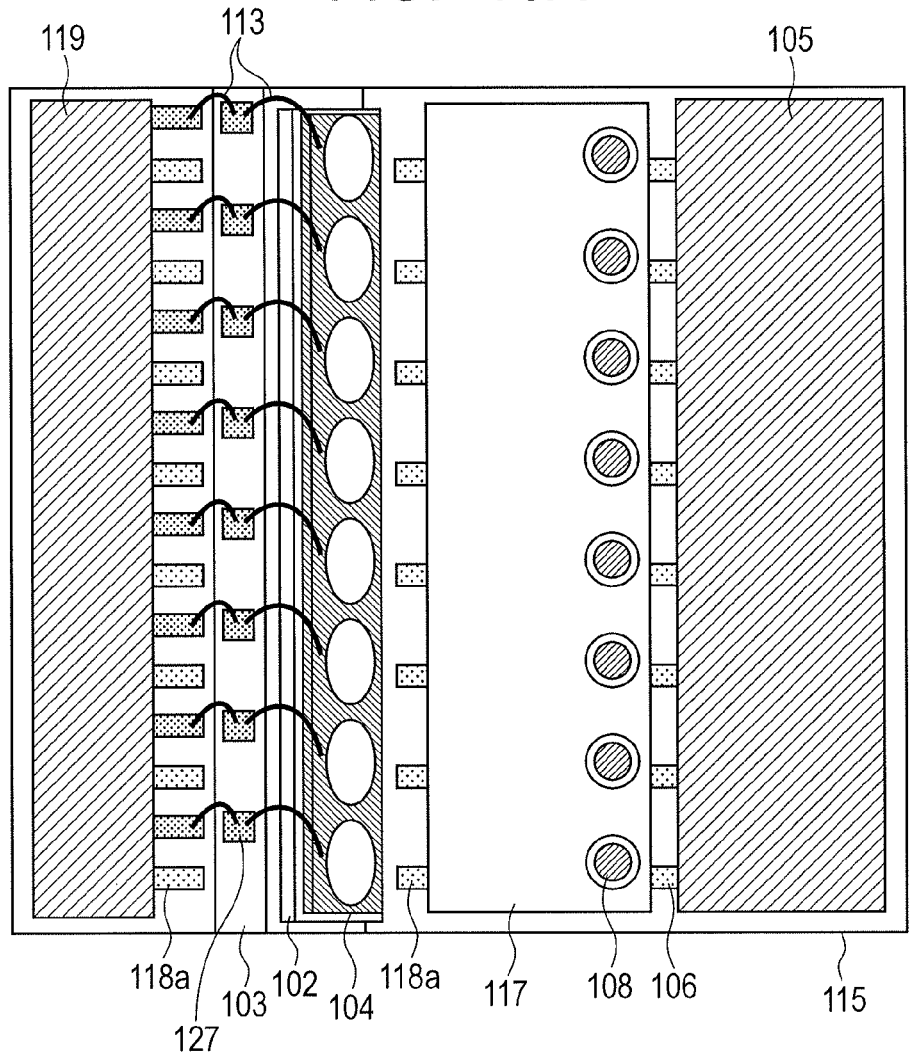
FIGS. 10A and 10B are a top view and a cross sectional view of the optical module of the seventh embodiment.
Figure 10B:
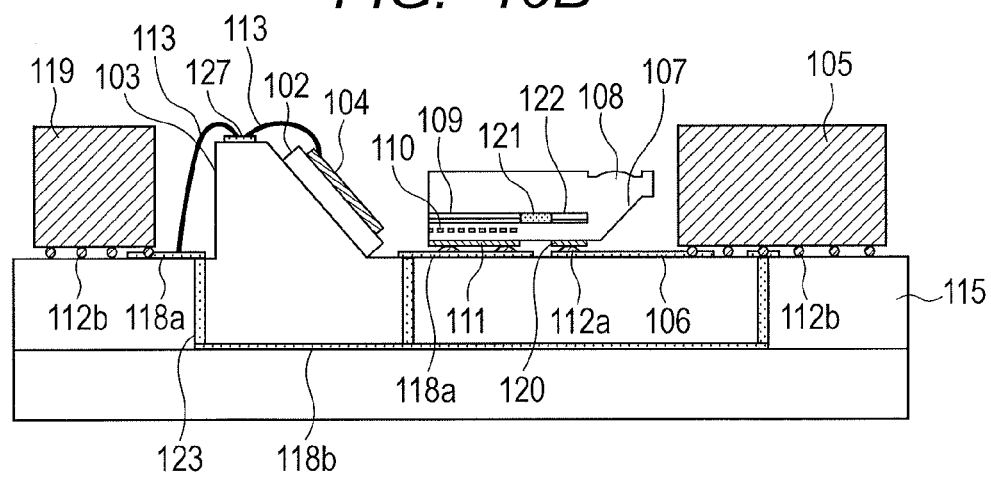

The optical module of the seventh embodiment is described next utilizing the top view of the optical module in FIG. 10A and the cross sectional view of the optical module in FIG. 10B.

The point differing from the third embodiment is that the photo diode array 104 and the modulation drive circuit 105, and also the photo diode array 104 and the continuous-wave drive circuit 119 are electrically coupled by way of the wire 113, the electrical wire pad 127, the via 123, the electrical wire 118b, and the solder 112b. Given the same bias drive conditions, the intensity and extinction ratio of the optical signal usually tend to vary due to environmental temperature fluctuations and changes over time. However the extinction ratio and the light intensity can be maintained at the desired value as achieved in the present embodiment, by electrically coupling the photo diode array 104 to the modulation drive circuit 105; and the photo diode array diode 104 to the continuous-wave drive circuit 119; and by providing feedback control to the modulation drive circuit 105 and the continuous-wave drive circuit 119 so that each photo diode emits a fixed photocurrent.

Eighth Embodiment

The first through the seventh embodiments utilized optical devices formed over an insulating substrate. The present embodiment utilizes a laminated structure in which individual optical devices are comprised of a conductive substrate and semiconductor layers laminated over that conductive substrate and electrodes are arranged so as to enclose the optical devices including the conductive substrate.

Figure 11A:
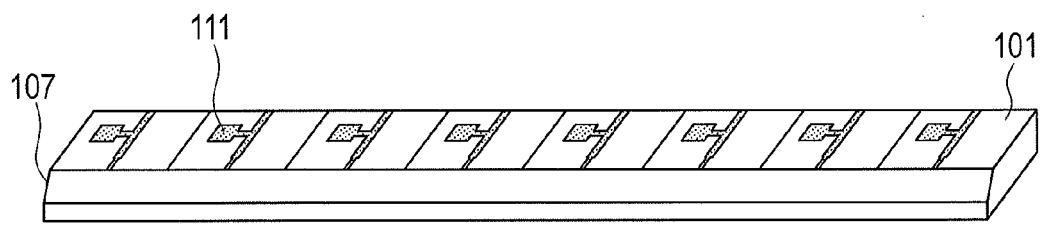
FIGS. 11A and 11B and 11C are top birds eye perspective views of the optical modulator device of the eighth embodiment utilizing the conductive substrate for supplying signals from the double-sided conductive substrate.
Figure 11B:
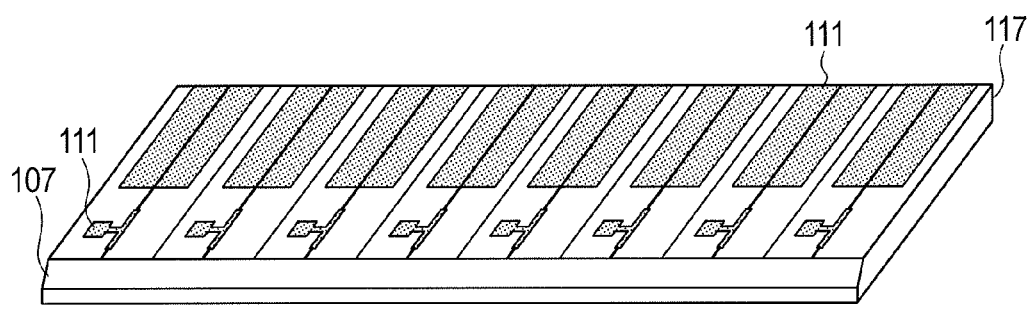
Figure 11C:
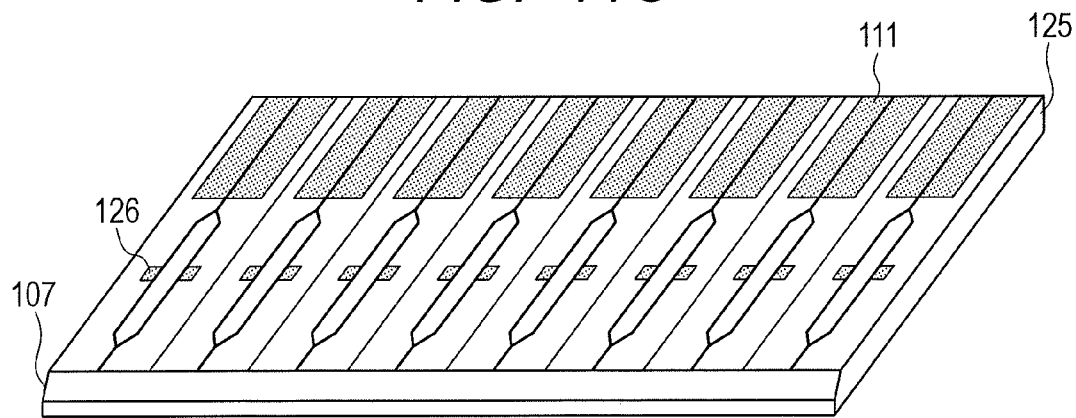

FIG. 11A is a drawing showing the layout on the upper surface side of the optical modulator device array containing the direct modulation laser. FIG. 11B is a drawing showing the layout on the upper surface side of the electro-absorption modulator integrated DFB laser (or EA/DFB laser). FIG. 11C is a drawing showing the layout on the upper surface side MZ modulator integrated DFB laser.

Figure 12:
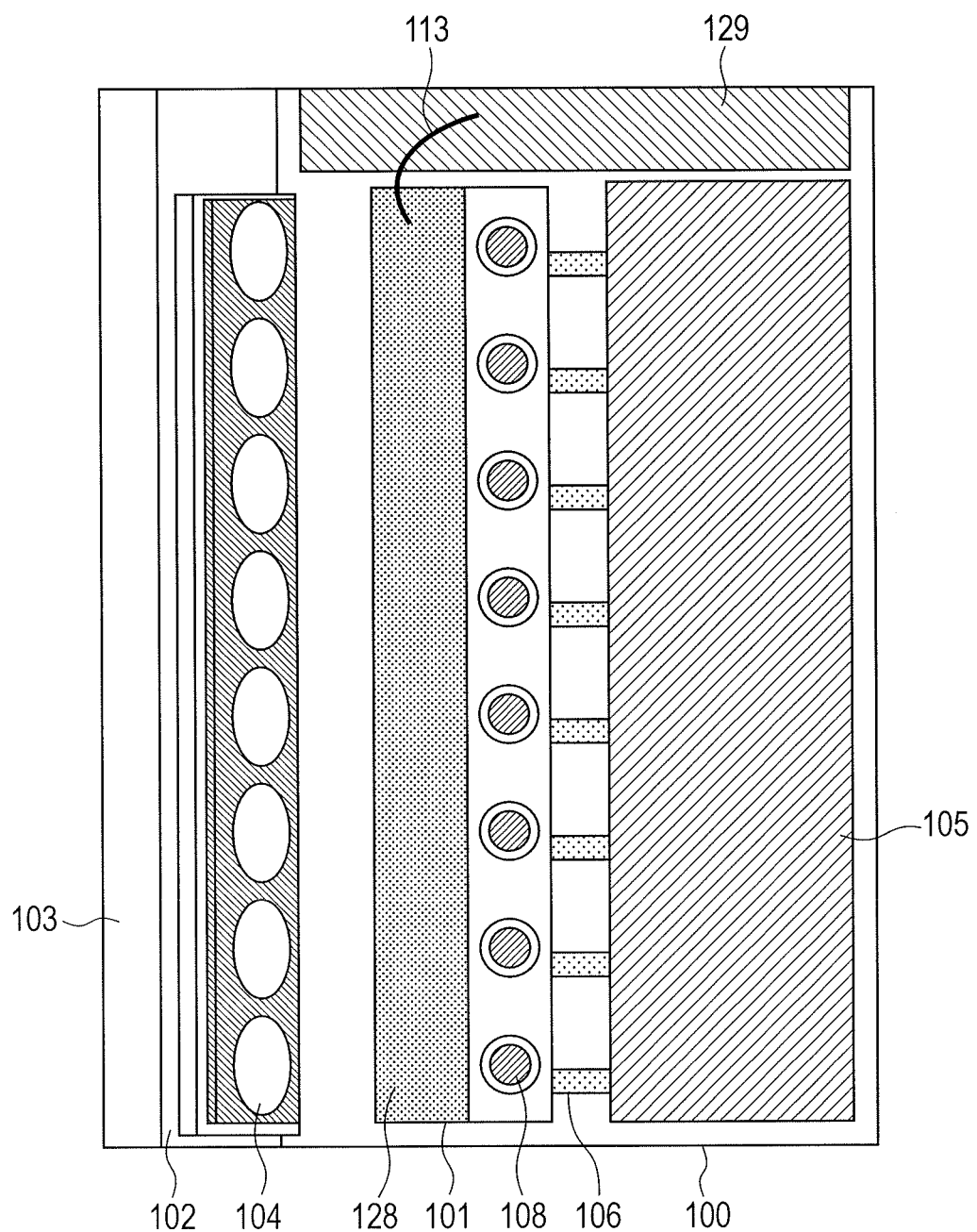
FIG. 12 is a top view of the optical module for supplying signals from the double-sided conductive substrate and utilizing a conductive substrate as the optical modulator device of the first embodiment.

By changing to the conductive substrate and changing to this type of laminated structure with electrodes enclosing a semiconductor laminated piece and a conductive substrate, the n-electrode 128 of the taper mirror integrated surface emitting type laser array 101 can be coupled by the wire 113 to wiring pattern 129 over the substrate 100 as shown in FIG. 12.

Even the second through the seventh embodiments which utilized optical devices formed over an insulating substrate can be changed to employ the same structure as this embodiment, namely a laminated structure utilizing conductive substrates for individual optical devices, and a laminated structure of electrodes enclosing the semiconductor laminated piece and conductive substrate. Utilizing this structure permits forming the wiring pattern 129 over the substrate 100 or over the multi-layer substrate 115 as shown in FIG. 12, and joining the wire 113 to the wiring pattern 129.

What is claimed is:

1. An optical module comprising:
   an optical device containing a taper mirror integrated onto an optical modulator device; and a first drive circuit to modulate the optical modulator device, wherein the optical modulator device and the first drive circuit are mounted at positions on the same optical axis, and the taper mirror is interposed between the optical modulator device and the first drive circuit, such that modulated light is emitted from the optical modulator device toward the first drive circuit, and wherein the taper mirror reflects the modulated light such that the reflected modulated light propagates in a direction that is substantially perpendicular to a surface of a substrate over which the optical modulator device is mounted.

2. The optical module according to claim 1, wherein, the optical device is any one among an EA (electro-absorption) modulator integrated DFB laser, an MZ (Mach-Zehnder) modulator integrated DFB laser, and an integrated device on which a light source, a modulator device, and a semiconductor optical amplifier are integrated.

3. The optical module according to claim 1, wherein the substrate contains a step, wherein the first drive circuit is mounted over a lower step surface of the substrate, wherein the optical device is mounted over an upper step surface of the substrate, and wherein a wire couples the first drive circuit to electrical wiring over the upper step surface of the substrate.

4. The optical module according to claim 1, wherein the first drive circuit and the optical device are flip chip bonded over the same layer of the substrate.

5. The optical module according to claim 1, further comprising:

a photo diode to monitor the output of the optical device, wherein the photo diode and the first drive circuit, which partially surround the optical device, are mounted at positions on the same optical axis.

6. The optical module according to claim 5, wherein the light receiving surface of the photo diode is tilted towards the substrate surface where the optical device is mounted.

7. The optical module according to claim 1, wherein the taper mirror, optical modulator device, and laser diode are integrated in that sequence in the optical device, and the optical module further includes a second drive circuit to supply direct current to the laser diode, and wherein the second drive circuit and the taper mirror, which partially surround the laser diode, are mounted at positions on the same optical axis.

8. The optical module according to claim 7, wherein the substrate contains a step section, wherein the second drive circuit is mounted over a lower step surface of the substrate, wherein the optical device is mounted over an upper step surface of the substrate, and wherein a wire couples the second drive circuit to electrical wiring on the upper step surface of the substrate.

9. The optical module according to claim 7, wherein the second drive circuit and the optical device are flip chip bonded over the same substrate.

10. The optical module according to claim 1, wherein the taper mirror is the only optical component that is arranged between the optical modulator device and the first drive circuit.

11. The optical module according to claim 1, further comprising:

a photo diode to monitor the output of the optical device, wherein the photo diode and the first drive circuit are mounted on opposite sides of the optical device.

12. The optical module according to claim 11, wherein the photo diode and the first drive circuit are mounted at positions on the same optical axis.

* * * * *